(12) United States Patent
Hofmeister

(10) Patent No.: US 6,364,592 B1
(45) Date of Patent: Apr. 2, 2002

(54) SMALL FOOTPRINT CARRIER FRONT END LOADER

(75) Inventor: Christopher Hofmeister, Hampstead, NH (US)

(73) Assignee: Brooks Automation, Inc., Chelmsford, MA (US)

( * ) Notice: Subject to any disclaimer, the term of this patent is extended or adjusted under 35 U.S.C. 154(b) by 0 days.

(21) Appl. No.: 09/452,306

(22) Filed: Dec. 1, 1999

(51) Int. Cl.[7] ............................................. B65G 49/07
(52) U.S. Cl. ............. 414/217; 414/222.13; 414/225.01; 414/939; 414/941
(58) Field of Search .................... 414/217, 939, 414/941, 225.01, 222.13

(56) References Cited

U.S. PATENT DOCUMENTS

| | | | |
|---|---|---|---|
| 5,019,233 A | * 5/1991 | Blake et al. ............ | 414/217 X |
| 5,460,478 A | * 10/1995 | Akimoto et al. ......... | 414/941 X |
| 5,518,542 A | * 5/1996 | Matsukawa et al. ..... | 414/941 X |
| 5,553,396 A | * 9/1996 | Kato et al. .............. | 414/225 |
| 5,740,034 A | * 4/1998 | Saeki ...................... | 414/331 X |

* cited by examiner

*Primary Examiner*—Steven A. Bratlie
(74) *Attorney, Agent, or Firm*—Perman & Green, LLP

(57) ABSTRACT

An apparatus for moving substrates between a loading section and a working chamber includes at least two loading locations at which the substrates may be supplied or received in stacked form therein. Load locks are provided at a second station each located directly oppositely of the locations at the loading station and corresponding in number to those locations. A substrate handling mechanism is disposed between the loading and the second stations for picking up and moving the substrates between the loading and second stations and includes linear positioning apparatus movable along a track of given width for positioning the handling mechanism along the given line, and the loading and second stations being separated from one another substantially only by the given width of the linear positioning apparatus.

12 Claims, 2 Drawing Sheets

SMALL FOOTPRINT CARRIER FRONT END LOADER

BACKGROUND OF THE INVENTION

The present invention relates to an apparatus for transferring substrates between a loading of such substrates and a processing station wherein a loading section is provided as part of the processing apparatus in which a transport robot is moved lengthwise along the length of a loading section. The invention hence resides in an improvement in such a processing apparatus whereby the loading section has a reduced footprint thereby providing for greater utilization of the workspace clean room.

FIELD OF THE INVENTION

The method of the present invention relates generally to material transfer devices. The material transfer might conclude but not be limited to semiconductor wafers, such as silicone and gallium arsenide, semiconductor packaging substrates such as high density interconnects HDI, semiconductor manufacturing processing imaging plates, such as masks or recticles, and large area display panels, such as activate matrix LCD substrates.

The need for high throughput transport devices which can move a substrate or workpiece between remote locations within highly confined areas as defined by a limited footprint, such as found in facilities where the manufacturer of wafers or panels used in the semiconductor industry are in high demand. This is because in the process of manufacturing, not just in the semiconductor industry, the need to move a workpiece from one position to the next not only requires a high throughput rate, but also accuracy of repeatability of placement of workpieces in registration at predetermined orientation on a supporting surface. Still a further constraint is to fabricate a positioning machine which is capable of working in a clean room environment where the distance of particulates is minimized if not nonexistent. In such clean room environments, floor space is at a premium.

Copending U.S. application Ser. No. 09/044,820 entitled Method of Transferring Substrates With Two Different Substrate Holding End Effectors" discloses a substrate processing apparatus as illustrated in FIG. 1. As is typical, the apparatus indicated generally as 10 in that application comprises a treatment section 11 and a substrate loading section 13. The treatment section 11 generally comprises a robot transport mechanism 12, substrate processing modules 14 connected to a main chamber 15 and load locks 16. The treatment section 11 may be any one of a number of substrate treatment sections well known in the art. As seen in FIG. 2, it should be seen that the loading section 13 generally comprises a frame 20, a substrate stocker 24, two cassette load ports 26, 26, two substrate cassette door removers 28, 28 four buffer cassettes b1, b2, b3 and b4, a substrate aligner 30 and a substrate transport robot 32. The stocker 24 is adapted to hold a plurality of substrate sets or capsules, each cassette has a housing which can individually support substrates therein. However, one drawback with such a system is that the inclusion of all these elements on the frame, causes the footprint of the device to be sizable, even taken relative to other components in the system. As previously stated, there is a premium placed on the area where such throughput transport devices operate, because such areas are highly confined and require machines to have a limited footprint.

Accordingly, it is an object of the invention to provide a device which is capable of moving substrates between a wafer carrier and a main transport chamber using a small footprint design.

It is a further object of the invention to provide a device of the aforementioned type which is capable of automatic transport of substrates from one location to another.

Still a further object of the invention is to provide a device of the aforementioned type wherein substrates carried by the device are moved with a high degree of accuracy and precision.

Other objects and advantages of the invention will become apparent from the following disclosure and the appended claims.

SUMMARY OF THE INVENTION

The invention resides in an apparatus for moving substrates between a loading of such substrates and a working chamber and comprises a frame and a loading station connected to the frame and having at least two loading locations wherein the plurality of substrates may be supplied or received in stacked form therein. A plurality of load locks are provided at a second station located each directly oppositely one of the locations at the loading station and corresponding in number to the locations at the loading station. The loading station and the second station being disposed oppositely of one another along a given line of separation. A substrate handling means is disposed between the loading and the second stations for picking up and moving one or a plurality of ones of the substrates between the loading and second stations. The substrate handling means includes a linear positioning mechanism movable along a track of given width for positioning the handling means along the given line, and the loading and second stations being separated from one another substantially only by the given width of the linear positioning mechanism.

DETAILED DESCRIPTION OF THE PREFERRED EMBODIMENT

Figure 1:
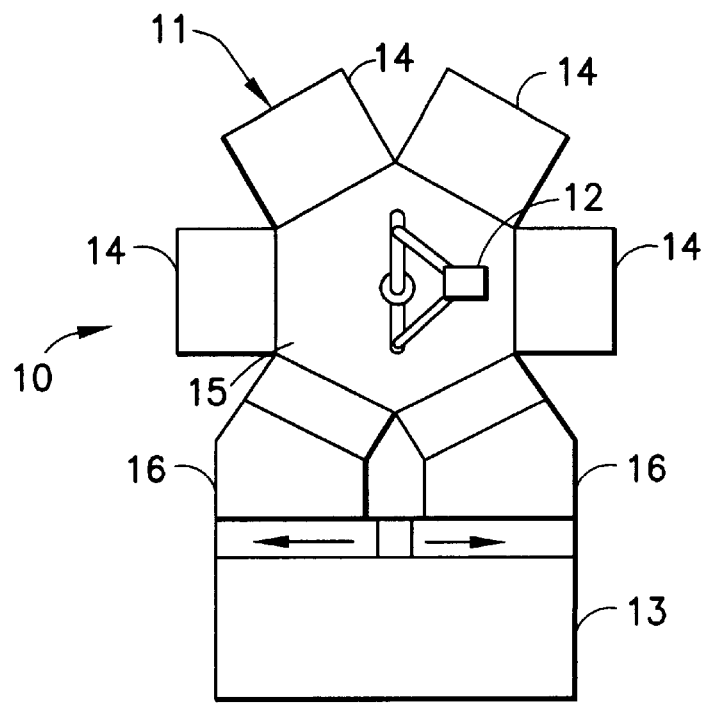
FIG. 1 is a schematic plan view of the system incorporating the present invention.

Referring to FIG. 1, there is shown a schematic top plan view of a substrate processing apparatus 10 incorporating features of the present invention. Although the present invention will be described with reference to the single embodiment shown in the drawings, it should be understood that the present invention may be embodied in many different alternative forms or embodiments. In addition, any suitable size, shape or type of elements or materials could be used.

The apparatus 10 generally comprises a substrate treatment section 11 and a substrate loading section 13. The treatment section 11 generally comprises a robot arm transport mechanism 12, substrate processing modules 14 connected to a main chamber 15, and load locks 16. The treatment section 11 may be any one of a number of substrate treatment sections well known in the art. Therefore, the treatment section will not be described further herein.

Figure 2:
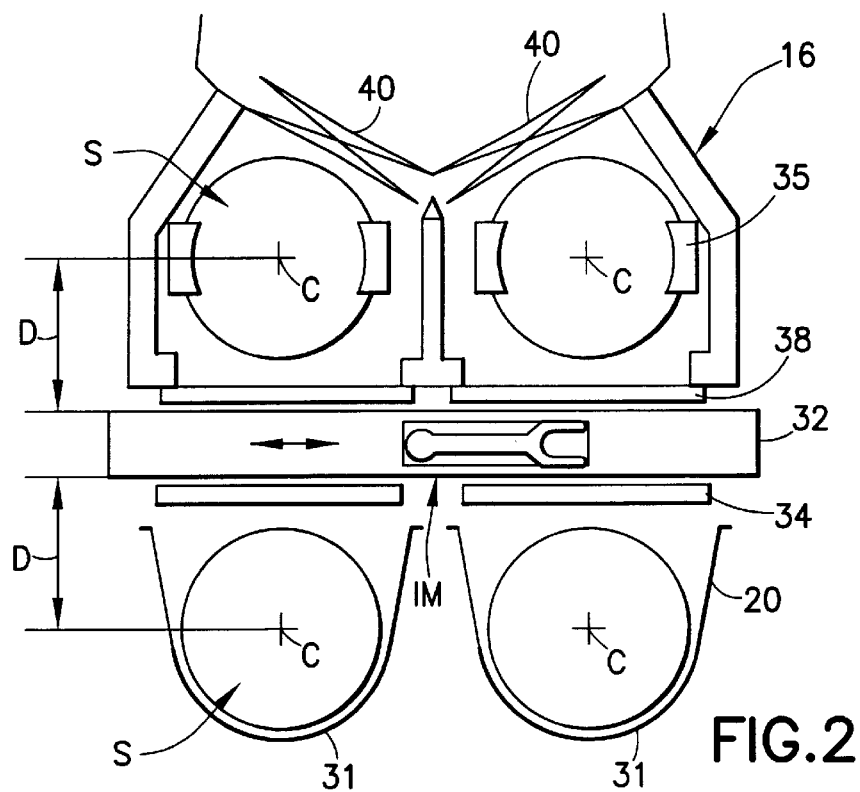
FIG. 2 is a partially fragmentary view of the front end loader/unloader of the invention.

Attached to the front end of the load locks 16 is the loading section 13. Referring also to FIG. 2, the loading section generally comprises a frame 20 which may be attached to clean room walls. The frame is however connected to the front faces of the load locks 36 so as to fixed in space relative to them to effect repeatable registration of substrates located within the load locks and the loading section 13.

Figure 3:
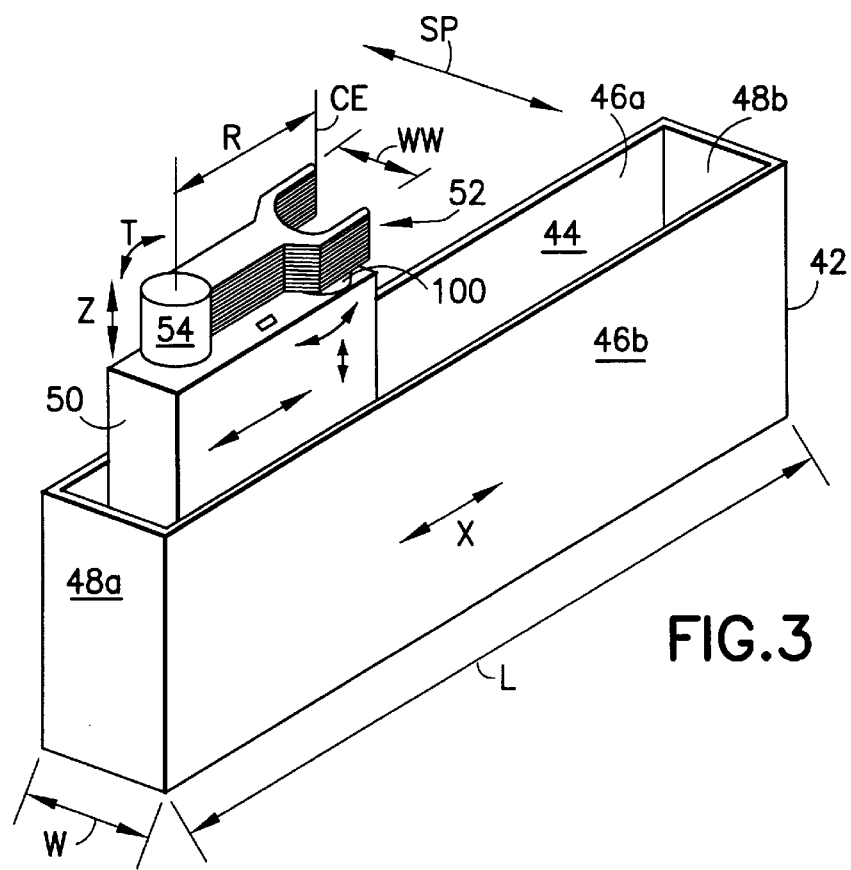
FIG. 3 is a perspective view of the transverse handler of the invention.

Referring now more specifically to FIGS. 2 and 3, it should be seen that the loading station 12 of the present invention includes two loading ports which receive one or more wafer carriers, single or dual, or a tool stocker, a loader module 32, carrier doors 34 interposed between the loading station 13 and the loader module 32. The load locks 16 have external valves 38 adapted sizewise for single or batch loading of substrates S between the loading station 13 and the load locks 36.

Within each load lock is provided a fixed cassette 31 having one or more stacked shelves 35 disposed in a vertically spaced arrangement. These shelves provide a resting space for individual substrates which are moved between the load lock 16 and the main transport chamber 15 and the loading station 13. Located between each load lock 16 and the main transport chamber 14 is an interior valve or door 40 which permits selective communication therebetween by the controlled opening and closing of the valves 40 to the main transport chamber 15.

A plurality of substrates S is housed in cassettes or FOUPs (Front Opening Unifer Pods) 31 which are secured against movement to the frame 20 of the station. The cassettes 31 are well known in the art. Each cassette 31 has a housing which can individually support substrates therein. Customarily the cassettes can support either thirteen or twenty-five substrates. The substrates are semi-conductor wafers, but the present invention could be used with other types of substrates, such as flat panel display substrates. The cassettes could also hold numbers of substrates other than thirteen or twenty-five. The cassettes 14 are loaded and unloaded onto and from the frame 20 of the station 13 at the load ports by a user. The carrier doors 34 are moved upwards to allow access to the interior of the cassettes by the loader module 32. In the case of tool stocker use, it preferably has the capacity to hold twenty 300 mm, 13 wafer capsils or ten 300 mm, 25 wafer capsils.

As illustrated in FIG. 3 the loader module 32 includes a base housing 42 which has a width W of between approximately 75 and 125 millimeters making its footprint substantially smaller than known loader modules. The loader module 32 has a length L which is sufficient to cover the faces of the confronting load locks 16, but need not be any longer. The base housing 42 forms a rectangular elongated guide track 44 by opposed sidewalls 46a, 46b, and opposing endwalls 48a, 48b which create the traveling slot or track 44 for a controllably movable linear positioning mechanism or traveling block 50.

The traveling block 50 is constrained to move along the indicated X axis within guide track 44. The traveling block 50 may be drivingly connected to a drive motor (not shown) through the intermediary of a controller for positioning the traveling block 50 in a controllable manner along the indicated X axis. The traveling block 50 may also be controllably positioned through the intermediary of a lead screw drive or like positioning means which is understood to be known in the art.

It is a further feature of the invention to provide the loader module 32 with one or more end effectors 52 which are sized and shaped so as to be controllably moved into and out of the loading station 13 and into and out of the confronting load locks 16 and cassettes 31. The illustrated embodiment shows the end effectors in a plural arrangement which is the preferred embodiment, but the invention could take the form of a single effector.

Each end effector has a length R which is about equal to the length D shown in FIG. 2. The length D is the perpendicular measurement between the respective sidewalls 46a, 46b of the guide track 44 and the centers C of the fixed cassette 35 in the loadlocks 16 and the centers C of the removable cassettes 31, respectively. Thus, when the end effector (s) 52 is rotated and linearly moved so as to be located within the fixed cassette or the removable cassettes in a perpendicular relationship to the guide track 44, the center of the end effector CE is located coincidentally with the centers C. It is desirable to have the centers C oriented along the same axis, but it is not necessary to the invention.

Each end effector also has a width WW which is slightly smaller in dimension than the width W of the base housing 42. Thus, when the end effectors are rotated to align the radius R with the X axis of the base housing, the effectors can be moved along the X axis without interference from the juxtaposed doors 38 and 34 associated respectively with the load locks 16 and the movable cassettes 31.

The end effectors 52 are further mounted on a common mounting post 54 which is in turn vertically movably mounted to the traveling block 50 through the intermediary of an elevator mechanism (not shown), in turn mounted within the traveling block 50. In addition to being vertically movably mounted to the traveling block 50, the mounting post 54 is also rotatably controllably mounted to the traveling block 50 through the intermediary of a theta drive (not shown) also housed within the traveling block. The theta drive is likewise controllably connected to a common controller which, through coordinated movement of the X axis drive, and the theta axis drive permits articulated movement of the end effectors 52 into and out of the loading stations 13 and the load locks 16. That is, using coordinated movement of the theta drive and the X axis drive, the substrate carried by the end effector realizes a movement along a straight path of travel SP which is disposed perpendicularly to the X axis.

As seen in FIG. 3, the end effectors 52 have a radius R of about 200 millimeters which may vary from between 250 millimeters to 500 millimeters depending on the size of substrate involved.

Thus, in use, the carrier door 34 of a given wafer carrier or stocker is opened, and the X, Z and theta axes drives are energized to position each of the end effectors 52 within a cassette 31 just beneath the substrates S supported on shelves therein. Since the carrier doors 34 and the load lock doors 38 are adequately wide to permit the substrates S to pass therebetween, this permits sufficient room for the end effectors to initially enter at an oblique angle into either the cassette in the loading station or into the load lock and be rotated simultaneously with the movement of the traveling block 50 in the X direction towards the centers C so as to ultimately position the end effectors 52 generally perpendicularly to the indicated X axis of the loader module 52 along line SP. Thereafter, the Z axis drive can be energized and the end effectors moved vertically to move the substrates onto or off of the involved shelves.

The one of the doors 34 and 38 which is located oppositely of the door opened to allow end effector positioning therewithin, is then opened and the movement of the end effectors is reversed so as to cause the substrates to be positioned intermediately of the load locks 36 and of the loading station 13. Thereafter, the traveling block 50 is again moved from the intermediate position IM shown in FIG. 2 toward the opposite chamber (either the load lock or the movable cassette) to be supplied, and simultaneously the end effectors are counter rotated from the direction previously taken in the loading sequence to position the substrates just above the shelves of the entered cassette. Thereafter the Z access drive is activated to lower the substrates onto the corresponding shelves of the cassette and the loading operation is completed. Unloading of the substrates S from the load locks to the loading station directly adjacent to it is done in a reverse manner.

Figure 4:
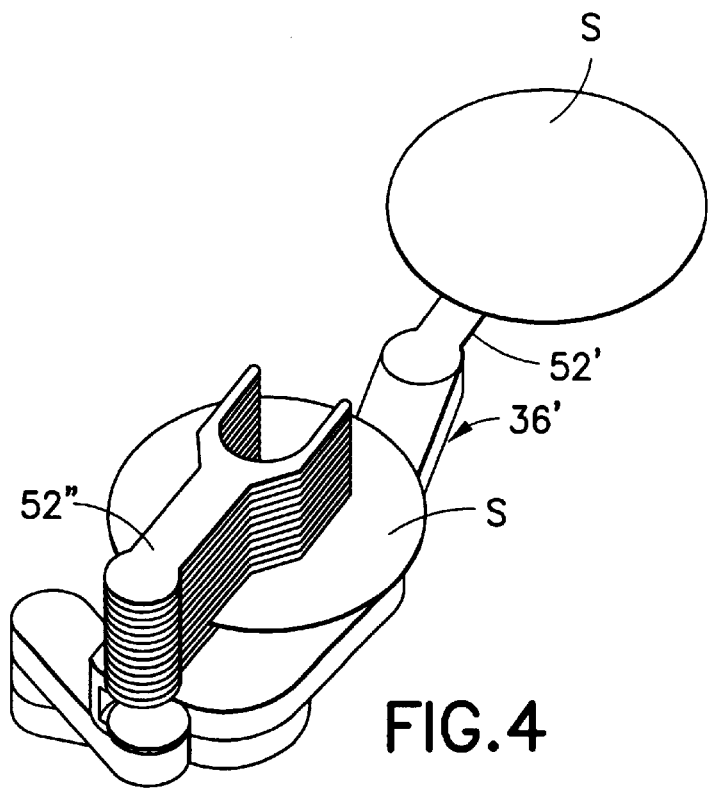
FIG. 4 shows an alternative embodiment of the end effector array.

Alternatively, as shown in FIG. 4, the end effectors 52', 52" may be of the type disclosed in copending U.S. application Ser. No. 09/223,508 filed on Dec. 30, 1998 and is hereby incorporated by reference. Here, the end effectors 52' and 52" are attached to an arm assembly 36'. The drive for the arm assembly is located within the travelling block 50 to effect the three axis movement discussed above. For a more complete description of the arm assembly 36' and its drive, reference may be made to copending U.S. Ser. No. 09/223, 508. Notwithstanding, it should be appreciated, that by activating and deactivating the respective motors associated with the powered drive of each end effector 52', 52", the batch end effectors 52" may be moved into the loading station 13 while the other end effector 52" may carry out some other function within the load locks 16 or vice versa.

By the foregoing a small footprint carrier front end loader has been described by way of the preferred embodiment. However numerous modifications and substitutions may be had without departing from the spirit of the invention. For example, the loader module 52 may be of a construction such that it has more than one arm for simultaneous movement between two stations. Also there is no need to use the system to process only a full batch. In addition, an aligner 100 may be provided as part of the system which is oriented on-center on the travelling block 50. Accordingly the invention has been described by way of illustration rather than limitation.

What is claimed is:

1. Apparatus for moving substrates between a loading station and a treatment section comprising:
   a frame;
   the loading station connected to the frame and having at least first and second loading locations wherein the substrates may be supplied or received in stacked form therein;
   at least first and second load locks at the treatment section connected to the frame, the first load lock located directly opposite the first loading location, the second load lock located directly opposite the second loading location;
   substrate handling means disposed between the loading station and the load locks for picking up and moving one or a plurality of the substrates between each corresponding loading location and load lock;
   a loader module for receiving and guiding the substrate handling means as it moves between the first and second positions, the loader module having opposed spaced apart parallel sidewalls having a width and opposed endwalls, the sidewalls and endwalls generally defining a rectangular elongated guide track; and wherein said substrate handling means includes a linear positioning means movable within the guide track for positioning said handling means along the guide track, the loading station and the load locks being separated from one another substantially only by the width of the loader module and the distance between the opposed parallel sidewalls being only sufficiently large to allow free movement in the guide track of the substrate handling means.

2. Apparatus as defined in claim 1 further characterized by said second station includes first and second chambers having a plurality of fixed cassettes disposed therein.

3. Apparatus as defined in claim 2 further characterized in that each of the loading station and the load locks includes a selectively sealable environment.

4. Apparatus as defined in claim 3 further characterized in that the selectively sealable environment for the substrates includes a chamber at the loading station having openings; the loading station having first and second doors opening to the substrate handling means for the respective loading and unloading of the substrates and the load locks having doors opening to the substrate handling means and located coincidentally with respective ones of the openings in said chamber at the loading station.

5. Apparatus as defined in claim 4 further characterized by the substrate handling means including at least one end effector.

6. Apparatus as defined in claim 5 further characterized by the substrate handling means including a plurality of end effectors arranged in a vertically parallel stacked relationship with one another.

7. Apparatus as in defined in claim 6 further characterized in that each of the end effectors has a length which is substantially equal to the perpendicular distance taken from the center of the load lock and loading station chamber to the linear positioning means.

8. Apparatus as defined in claim 7 further characterized in that said substrate handling means further includes means for rotating said plurality of end effectors about a vertical axis, and means for moving said plurality of end effectors vertically along said vertical axis.

9. Apparatus as defined in claim 8 further characterized in that the substrate handling means includes a travelling block movable along and within the guide track and that the means for vertically and rotationally moving the plurality of end effectors about the vertical axis is mounted on the travelling block.

10. Apparatus as defined in claim 8 further characterized by each of the plurality of end effectors having a free end and a radius as measured from the vertical axis to the free end, the radius having a dimension of between 400 to 500 mm.

11. Apparatus as defined in claim 10 further characterized by the centers of each of the loading locations and its associated loadlock being defined by a central point coincident with the center of each of the substrates when the substrates are disposed on the holders located at each of the load locks.

12. Apparatus as defined in claim 1 further characterized by the substrate handling means including a dual end effector arrangement.

* * * * *